US009867462B2

(12) United States Patent
Chen et al.

(10) Patent No.: US 9,867,462 B2
(45) Date of Patent: Jan. 16, 2018

(54) SLIDE RAIL DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/342,090

(22) Filed: Nov. 2, 2016

(65) Prior Publication Data

US 2017/0340109 A1 Nov. 30, 2017

(30) Foreign Application Priority Data

May 31, 2016 (TW) .............................. 105117119 A (51) Int. Cl.
*A47B 88/00* (2017.01)
*A47B 88/403* (2017.01)
*H05K 7/18* (2006.01)

(52) U.S. Cl.
CPC ........... *A47B 88/403* (2017.01); *H05K 7/183* (2013.01)

(58) Field of Classification Search
CPC ... A47B 88/427; A47B 88/423; A47B 88/403; H05K 7/183
See application file for complete search history.

(56) References Cited

U.S. PATENT DOCUMENTS

| | | | |
|---|---|---|---|
| 6,220,456 B1 | 4/2001 | Jensen | |
| 6,601,933 B1 | 8/2003 | Greenwald | |
| 6,945,619 B1 * | 9/2005 | Chen | A47B 88/487 312/334.44 |
| 7,758,134 B2 * | 7/2010 | Huang | A47B 88/49 312/334.47 |
| 8,317,037 B2 | 11/2012 | Henderson | |
| 8,366,217 B1 | 2/2013 | Chen | |
| 2009/0072689 A1 | 3/2009 | Yang | |
| 2009/0289155 A1 | 11/2009 | Yu | |

* cited by examiner

*Primary Examiner* — Amy J. Sterling
(74) *Attorney, Agent, or Firm* — Winston Hsu (57) ABSTRACT

A slide rail device is configured to mount a carried object. The carried object includes a plurality of mounting members. The slide rail device includes an auxiliary component, a slide rail, an operating member and a locking member. The slide rail is movable relative to the auxiliary component. The slide rail has a mounting path for allowing the mounting members of the carried object to pass through. The locking member is movable relative to the operating member between a first position and a second position. Wherein when the locking member is located at the first position, the locking member blocks the mounting path; wherein when the locking member is located at the second position, the locking member is away from the mounting path.

18 Claims, 12 Drawing Sheets

SLIDE RAIL DEVICE

BACKGROUND OF THE INVENTION

1. Field of the Invention

The present invention relates to a slide rail device, and more particularly, to a slide rail device configured to mount a carried object.

2. Description of the Prior Art

U.S. Pat. No. 6,220,456 B1 of Jensen et al. discloses a method and apparatus for supporting a computer chassis. A disclosed rack-mounted computer system comprises at least two posts (16). Two rails (20) are attached to the two corresponding posts. Each of the rails (20) comprises two ribs (24) that together define a slot (26). One portion of the slot (26) has a greater separation. A computer component chassis (12) includes two faces (100, 102) on its outer surface. Each face has at least one protuberance (104). The protuberances are shaped to fit at least partially into the slot (26) of one of the rails.

As such, the rail (20) disclosed in the aforementioned case comprises a slot (26). The slot (26) is configured to accommodate the protuberance (104) of the computer component chassis (12) and hold the protuberance (104) through the pair of ribs (24), such that the computer component chassis (12) can be supported by the pair of ribs (24). However, the slot (26) of the rail (20) is an open path. That is to say, the protuberance (104) of the computer component chassis (12) can freely enter into or depart from the slot (26). Therefore, for safety consideration, the way of mounting the computer chassis (12) to the rail (20) is required to be improved.

SUMMARY OF THE INVENTION

The present invention relates to a slide rail device configured to mount a carried object.

According to an embodiment of the present invention, a slide rail device is configured to mount a carried object. The carried object comprises at least one mounting member. The slide rail device comprises an auxiliary component, a slide rail, an operating member, and a locking member. The slide rail is movable relative to the auxiliary component. The slide rail has a mounting path for allowing the at least one mounting member of the carried object to pass through. The locking member is movable relative to the operating member between a first position and a second position. Wherein when the locking member is located at the first position, the locking member blocks the mounting path; wherein when the locking member is located at the second position, the locking member is away from the mounting path.

Preferably, the auxiliary component has a through hole. The slide rail device further comprises an engagement member mounted to the auxiliary component. The engagement member has an elastic part and an engagement part. The engagement part is configured to be engaged with the through hole in response to an elastic force of the elastic part.

Preferably, one of the slide rail and the engagement part has a disengagement feature. The disengagement feature comprises an inclined face or a curved face.

Preferably, the slide rail comprises an auxiliary hole. The engagement part of the engagement feature is configured to pass through the auxiliary hole in response to the elastic force of the elastic part.

Preferably, the slide rail comprises a first hole wall and a second hole wall. The auxiliary hole is located between the first hole wall and the second hole wall.

Preferably, the slide rail device further comprises a movable member movably mounted to the slide rail. When the slide rail is moved relative to the auxiliary component from an extended position toward a retracted position, the engagement part of the engagement member is configured to block the movable member, and the movable member is moved relative to the slide rail in response to the blocking of the engagement part, in order to drive the locking member to move from the second position to the first position Preferably, the slide rail device further comprises a movable member movably mounted to the slide rail. When the locking member is moved from the first position to the second position, the movable member is moved in response to the movement of the locking member, and the locking member abuts against the operating member.

Preferably, the slide rail device further comprises an elastic member configured to provide an elastic force between the locking member and the movable member.

Preferably, the locking member comprises a first abutting part. The operating member comprises a second abutting part. When the operating member is operated, the locking member is moved from the first position toward the second position in response to the operation of the operating member, and the first abutting part of the locking member abuts against the second abutting part of the operating member in order to hold the locking member at the second position.

Preferably, one of the slide rail and the movable member has an extension hole. The slide rail device further comprises a connecting member penetrating through a portion of the extension hole to be connected between the slide rail and the movable member.

Preferably, the locking member is movably mounted to the slide rail.

Preferably, the operating member is movably mounted to the slide rail.

Preferably, one of the slide rail and the auxiliary component has a mounting hole. The slide rail device further comprises a connecting member penetrating through a portion of the mounting hole to be connected between the auxiliary component and the slide rail.

According to another embodiment of the present invention, a slide rail device comprises a slide rail and a locking member. The slide rail has a mounting path for allowing at least one mounting member of a carried object to pass through. The locking member is movably mounted to the slide rail. Wherein when the locking member is located at a first position, the locking member blocks the mounting path; wherein when the locking member is located at a second position, the locking member is away from the mounting path.

According to another embodiment of the present invention, a slide rail device is configured to mount a carried object to a rack. The carried object comprises at least one mounting member. The slide rail device comprises an auxiliary component, a slide rail, a locking member, an operating member, a movable member, and an engagement member. The auxiliary component is mounted to the rack. The slide rail is movable relative to the auxiliary component. The slide rail has an auxiliary hole and a mounting path. The mounting path is configured to allow the at least one mounting member of the carried object to pass through. The operating member is configured to operatively move the locking member between a first position and a second position. The movable member is movably mounted to the slide rail. The engagement member is mounted to the auxiliary component. The engagement member has an elastic part and an engagement part. Wherein when the locking member is located at the first position, one of the locking member and the operating member blocks the mounting path; wherein when the locking member is located at the second position, one of the locking member and the operating member is away from the mounting path; wherein when the locking member is located at the second position and the slide rail is moved relative to the auxiliary component from an extended position toward a retracted position, the engagement part of the engagement member passes through the auxiliary hole of the slide rail in response to the elastic force of the elastic member to block the movable member, and the movable member is moved relative to the slide rail in response to the blocking of the engagement part, in order to drive one of the locking member and the operating member to move from the second position to the first position.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
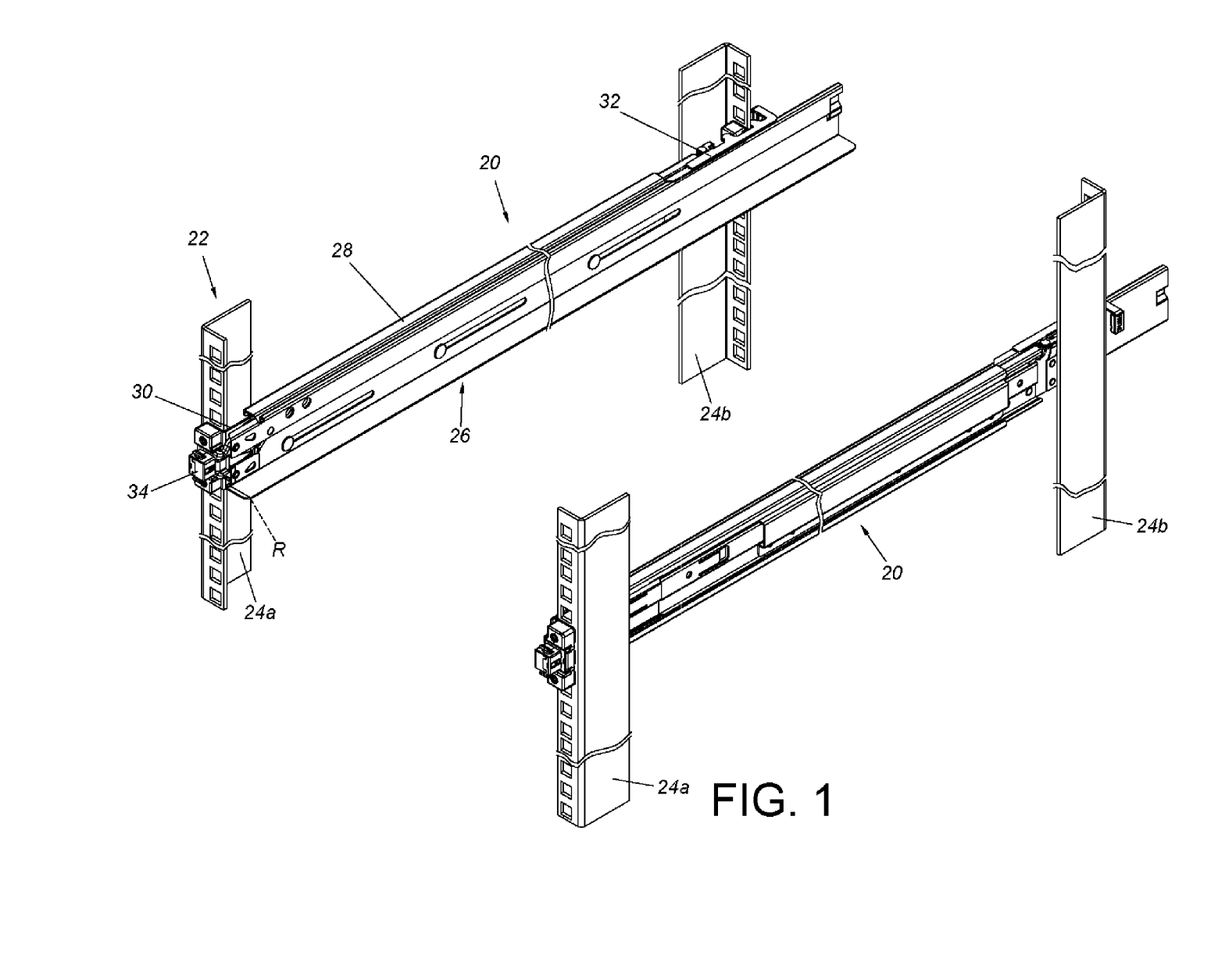
FIG. 1 is a diagram showing a pair of slide rail devices being mounted to a rack according to an embodiment of the present invention.

FIG. 1 is a diagram showing a pair of slide rail devices 20 applicable to a rack 22 according to an embodiment of the present embodiment. In particular, each of the slide rail devices 20 is mounted to a first post 24a and a second post 24b of the rack 22. Each of the slide rail devices 20 comprises a slide rail 26. Preferably, the slide rail 26 can be mounted to the first post 24a and the second post 24b through an auxiliary component 28. Furthermore, the auxiliary component 28 can be a slide rail (such as a fixed rail), a bracket base or the like. Two parts of the auxiliary component 28 (such as a front part and a rear part) can be respectively mounted to the first post 24a and the second post 24b through a first bracket 30 and a second bracket 32. In addition, the slide rail 26 can be located at a retracted position R relative to the auxiliary component 28. Preferably, the slide rail device 20 further comprises a fastening device 34 connected to the slide rail 26. When the slide rail 26 is located at the retracted position R, the fastening device 34 is adjacent to the first post 24a or the first bracket 30.

Figures 2, 3, 4:
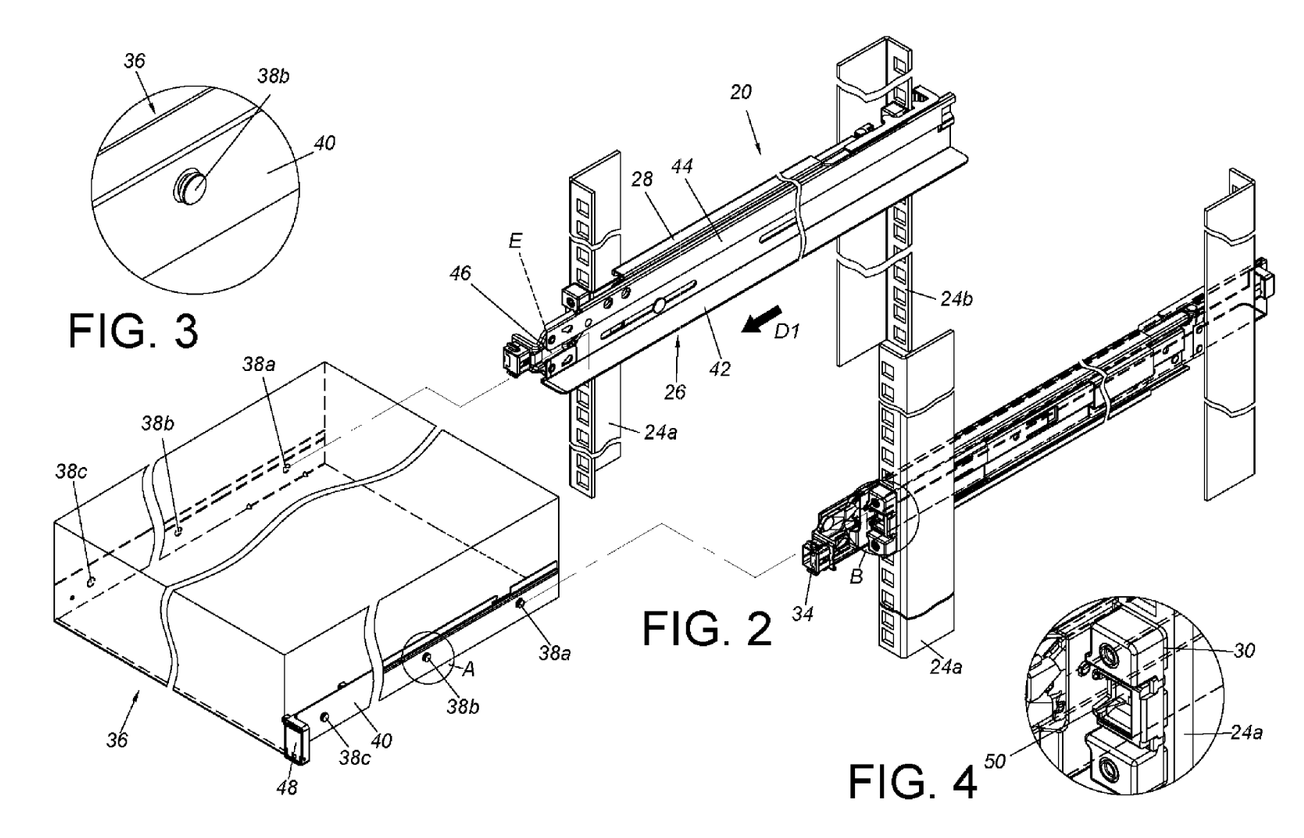
FIG. 2 is an exploded view of the slide rail devices of FIG. 1 configured to mount a carried object.
FIG. 3 is an enlarged view of an area A of FIG. 2 for illustrating the carried object having at least one mounting member.
FIG. 4 is an enlarged view of an area B of FIG. 2 for illustrating a post or a bracket having at least one hole.

As shown in FIG. 2, the slide rail device 20 is configured to mount a carried object 36. The carried object 36 can be a chassis of an electronic apparatus or a drawer. The carried object 36 comprises at least one mounting member (or mounting part). In the present embodiment, the carried object 36 comprises a first mounting member 38*a*, a second mounting member 38*b* and a third mounting member 38*c*, for example. The mounting members 38*a*, 38*b*, 38*c* are located at a portion of the carried object 36, such as a side part 40.

As shown in FIG. 3, each of the mounting members (FIG. 3 only shows the second mounting member 38*b*) is protruded from the side part 40. The first mounting member 38*a*, the second mounting member 38*b* and the third mounting member 38*c* are spaced from each other. On the other hand, the slide rail 26 is capable of being moved relative to the auxiliary component 28 from the retracted position R to an extension position E along a first direction D1. The slide rail 26 is configured to mount the carried object 36. The slide rail 26 comprises a supporting part 42 and a side wall 44. The supporting part 42 is substantially perpendicularly connected to the side wall 44. The slide rail 26 has a mounting path 46 for allowing the mounting members 38*a*, 38*b*, 38*c* of the carried object 36 to pass through, and the supporting part 42 of the slide rail 26 is configured to support the carried object 36. Preferably, the carried object 36 further comprises an ear part 48 configured to engage with the fastening device 34. As shown in FIG. 4, the fastening device 34 can be mounted to at least one hole 50 of the first bracket 30 (or the first post 24*a*).

Figures 5, 6, 7:
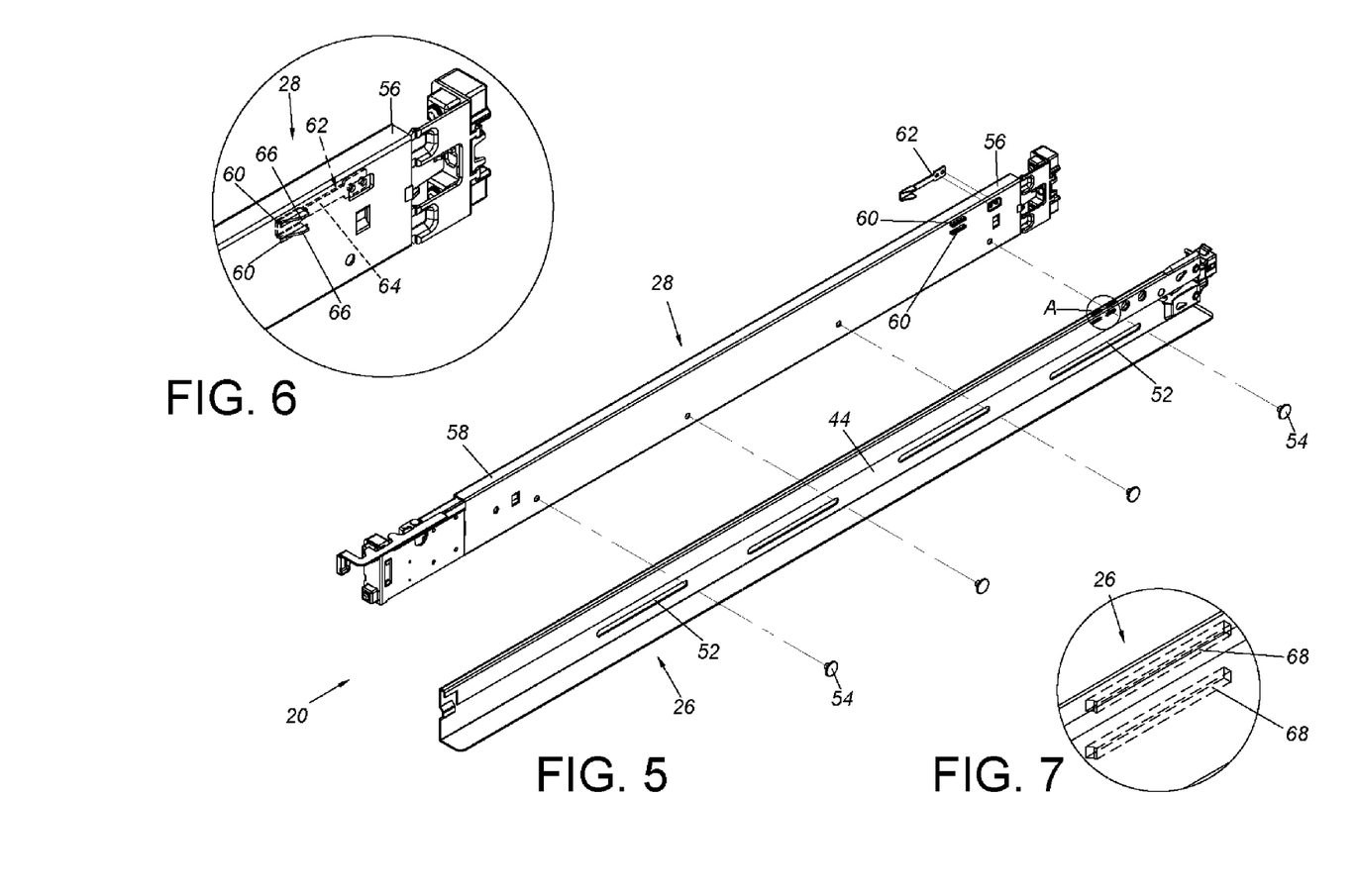
FIG. 5 is an exploded view of the slide rail device according to an embodiment of the present invention.
FIG. 6 is a diagram showing an engagement member of FIG. 5 being mounted to an auxiliary component.
FIG. 7 is an enlarged view of an area A of FIG. 5 for illustrating a slide rail having at least one auxiliary hole.

As shown in FIG. 5, one of the slide rail 26 and the auxiliary component 28 has at least one mounting hole 52. In the present embodiment, the side wall 44 of the slide rail 26 has a plurality of mounting holes 52, for example. The plurality of mounting holes 52 are arranged along a longitudinal direction of the slide rail 26 and spaced from each other. The slide rail device 20 further comprises at least one connecting member 54 corresponding to the at least one mounting hole 52. In the present embodiment, the slide rail device 20 comprises a plurality of connecting members 54, for example. Each of the connecting members 54 penetrates through a portion of a corresponding mounting hole 52 to be connected between the auxiliary component 28 and the slide rail 26.

As shown in FIG. 6, the auxiliary component 28 has a front part 56 and a rear part 58. At least one through hole 60 is arranged between the front part 56 and the rear part 58 of the auxiliary component 28. In the present embodiment, the at least one through hole 60 is located adjacent to the front part 56 of the auxiliary component 28, for example. The slide rail device 20 further comprises an engagement member 62 mounted to the auxiliary component 28. A portion of the engagement member 62 can be mounted to the auxiliary component 28 by screwing, welding, or engaging. The engagement member 62 has an elastic part 64 and at least one engagement part 66 connected to the elastic part 64. The at least one engagement part 66 can be engaged with the at least one through hole 60 and face toward the slide rail 26 in response to the elastic force of the elastic part 64. Furthermore, as shown in FIG. 7, the slide rail 26 comprises at least one auxiliary hole 68 for allowing the engagement part 66 of the engagement member 62 to pass through.

Figure 8:
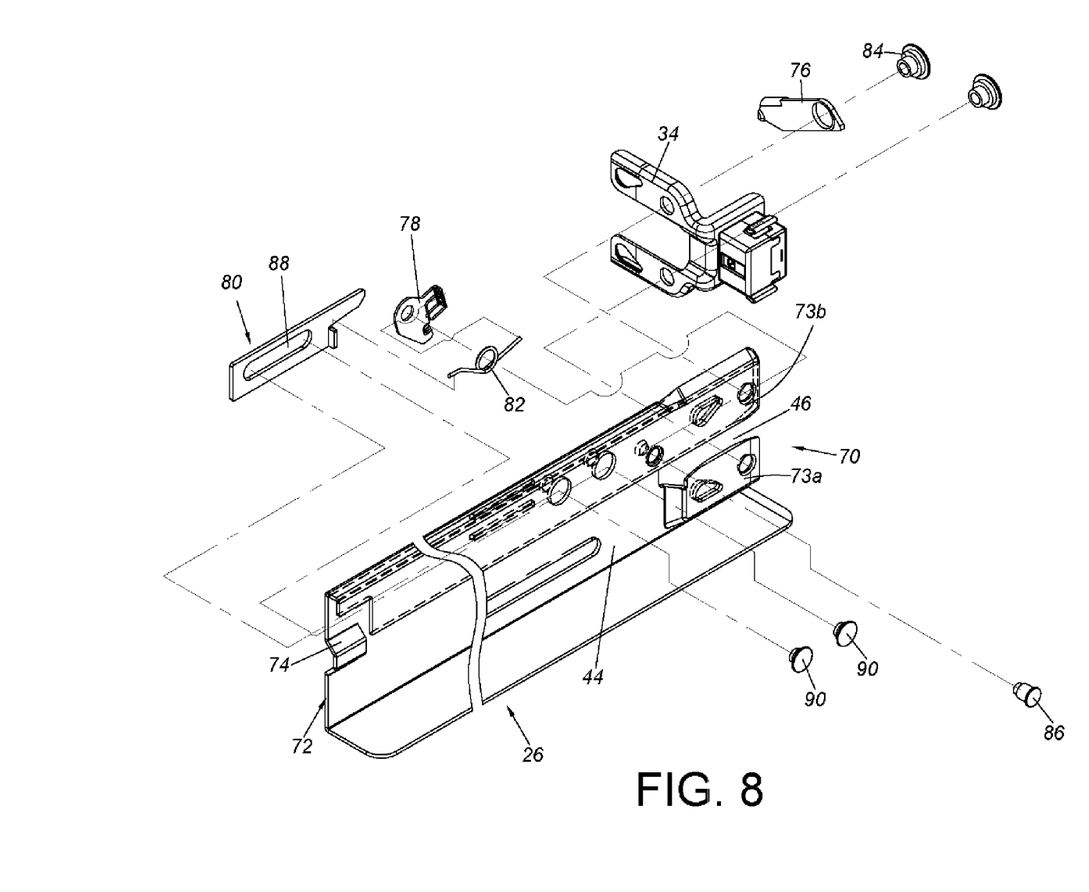
FIG. 8 is an exploded view of the slide rail of the slide rail device according to an embodiment of the present invention.
Figure 9:
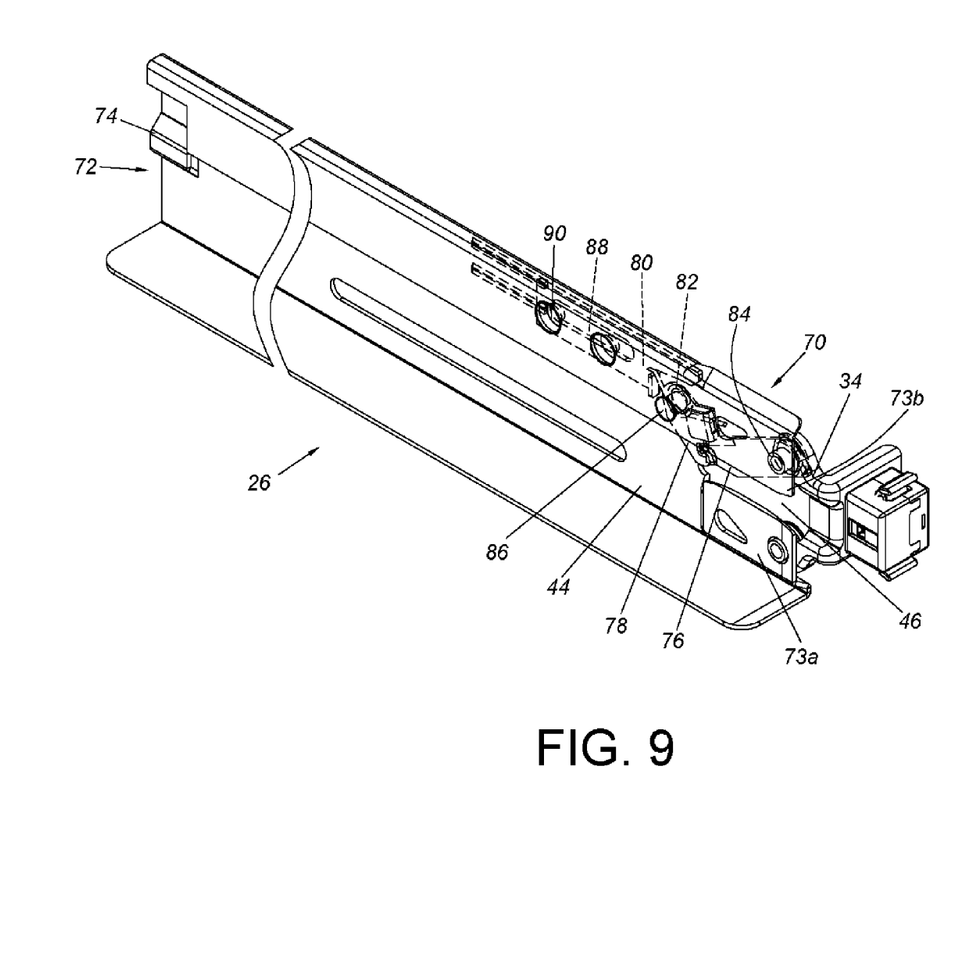
FIG. 9 is diagram showing the slide rail of FIG. 8.

As shown in FIG. 8 and FIG. 9, the slide rail 26 has a front part 70 and a rear part 72. In the present embodiment, the mounting path 46 is arranged adjacent to the front part 70 of the slide rail 26, for example. Preferably, the slide rail 26 has at least one wall section, such as a first wall section 73*a* and a second wall section 73*b* bent relative to the side wall 44. A mounting path 46 is formed between the first wall section 73*a* and the second wall section 73*b*. The mounting path 46 can be an opening or a groove, but not limited thereto. On the other hand, a blocking section 74 is arranged adjacent to the rear part 72 of the slide rail 26. The blocking section 74 is configured to abut against the carried object 36 when the carried object 36 is mounted to the slide rail 26.

The slide rail device 20 further comprises an operating member 76 and a locking member 78. Preferably, the slide rail device 20 further comprises a movable member 80 and an elastic member 82.

The operating member 76 is configured to operatively move the locking member 78. The operating member 76 is movably mounted to the slide rail 26. For example, the operating member 76 is pivoted to one of the side wall 44, the first wall section 73*a* and the second wall section 73*b* of the slide rail 26 by a first shaft member 84. In the present embodiment, the fastening device 34 is mounted to the first wall section 73*a* and the second wall section 73*b* of the slide rail 26 by two first shaft members 84.

The locking member 78 is movably mounted to the slide rail 26. For example, the locking member 78 can be pivoted to the side wall 44 of the slide rail 26 by a second shaft member 86.

The movable member 80 is movably mounted to the slide rail 26. One of the movable member 80 and the side wall 44 of the slide rail 26 has an extension hole 88. In the present embodiment, the movable member 80 has the extension hole 88, for example. The slide rail device 20 further comprises at least one connecting member 90, such as two connecting members 90 penetrating through a portion of the extension hole 88 to be connected between the slide rail 26 and the movable member 80.

The elastic member 82 is configured to provide an elastic force between the locking member 78 and the movable member 80.

Figure 10:
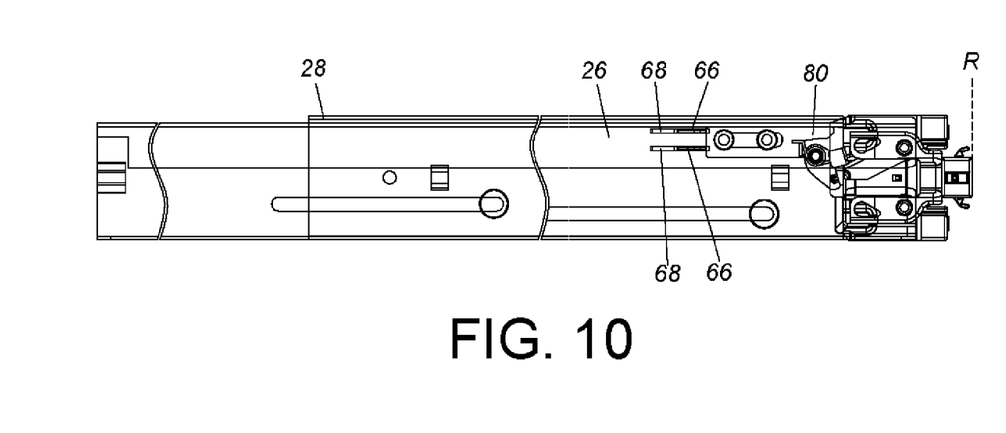
FIG. 10 is a diagram showing the slide rail of the slide rail device being located at a retracted position relative to the auxiliary component according to an embodiment of the present invention.
Figure 11:
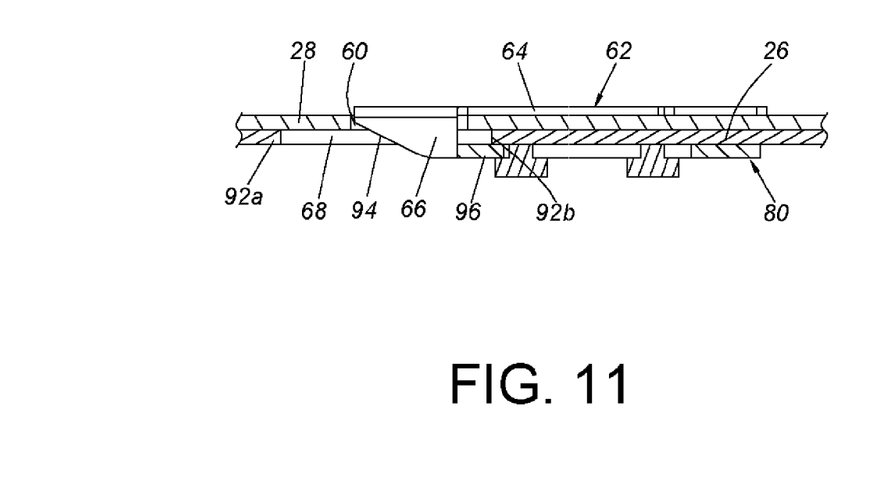
FIG. 11 is a diagram showing an engagement part of the engagement member of the slide rail device of FIG. 10 passing through a portion of the at least one auxiliary hole of the slide rail.

As shown in FIG. 10 and FIG. 11, when the slide rail 26 is located at the retracted position R relative to the auxiliary component 28, the engagement part 66 of the engagement member 62 is engaged with the through hole 60 of the auxiliary component 28 and penetrates through a portion of the auxiliary hole 68 of the slide rail 26 in response to the elastic force of the elastic part 64. Preferably, the slide rail 26 comprises a first hole wall 92*a* and a second hole wall 92*b*. The auxiliary hole 68 is located between the first hole wall 92*a* and the second hole wall 92*b*. One of the slide rail 26 and the engagement part 66 has a disengagement feature. In the present embodiment, the engagement part 66 has the disengagement feature 94, for example. The disengagement feature 94 can be an inclined face or a curved face. In addition, a portion 96 of the movable member 80 is located between the first hole wall 92*a* and the second hole wall 92*b* and corresponding to the engagement part 66.

Figure 12:
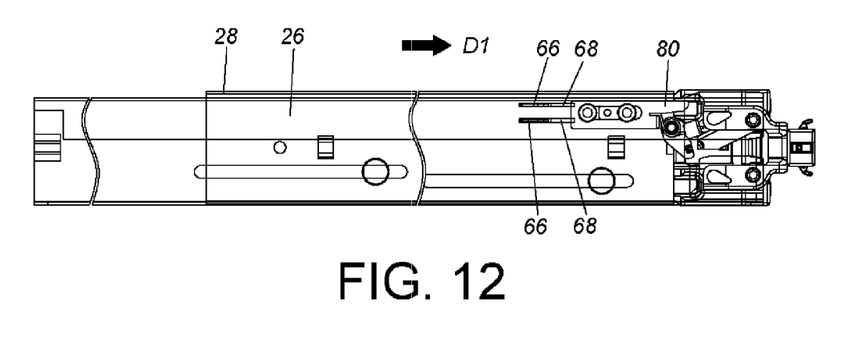
FIG. 12 is a diagram showing the slide rail of the slide rail device being moved relative to the auxiliary component along a first direction according to an embodiment of the present invention.
Figure 13:
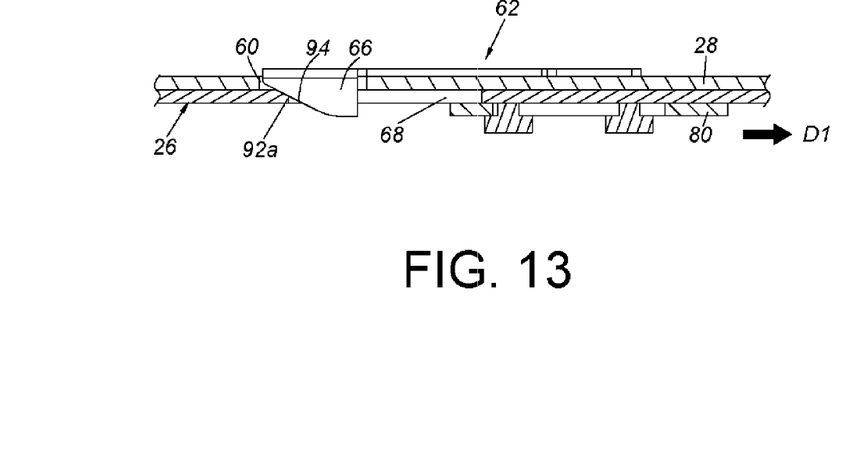
FIG. 13 is a diagram showing a portion of the slide rail of FIG. 12 contacting a disengagement feature of the engagement part of the engagement member.

As shown in FIG. 12 and FIG. 13, when the slide rail 26 is moved relative to the auxiliary component 28 from the retracted position R along the first direction D1, the first hole wall 92*a* of the slide rail 26 contacts the disengagement feature 94 of the engagement part 66.

Figure 14:
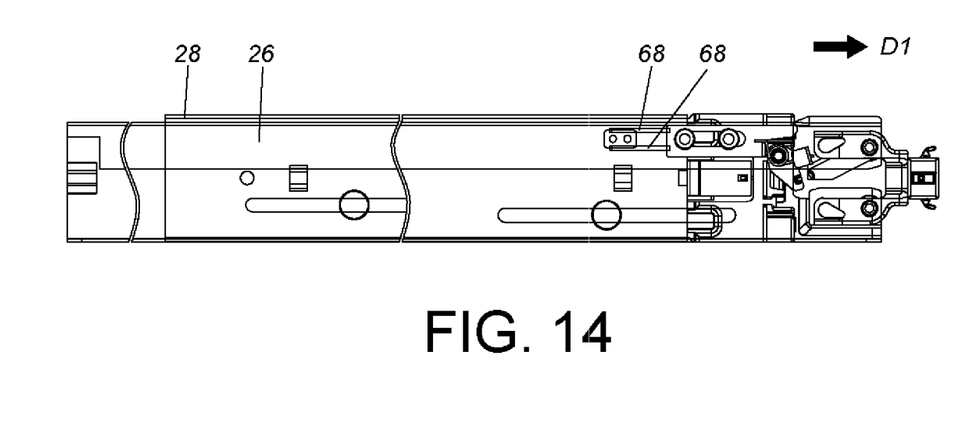
FIG. 14 is a diagram showing the slide rail of the slide rail device continuing to move relative to the auxiliary component along the first direction according to an embodiment of the present invention.
Figure 15:
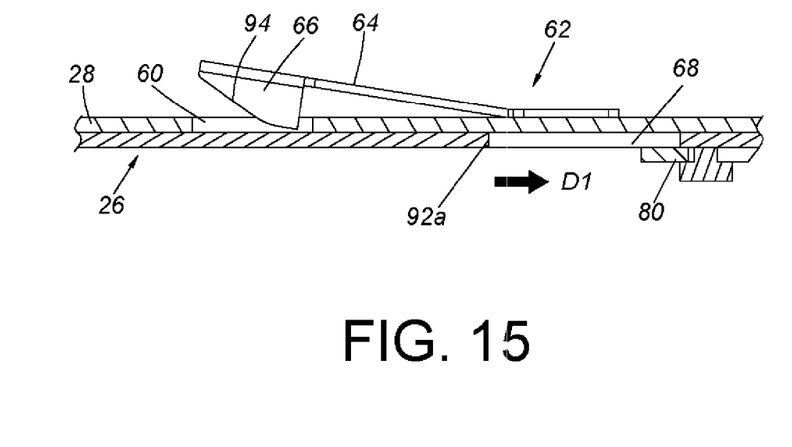
FIG. 15 is a diagram showing the engagement part of the engagement member of FIG. 14 being disengaged from the auxiliary hole of the slide rail to be adjacent to one side of the slide rail.

As shown in FIG. 14 and FIG. 15, when the slide rail 26 continues to move relative to the auxiliary component 28 along the first direction D1, the first hole wall 92*a* of the slide rail 26 abuts against the disengagement feature 94 of the engagement part 66 of the engagement member 62, in order to disengage the engagement part 66 from the auxiliary hole 68. Since the engagement part 66 is disengaged from the auxiliary hole 68 of the slide rail 26, the engagement part 66 is located adjacent to one side of the slide rail 26 in response to the elastic force of the elastic part 64.

Figure 16:
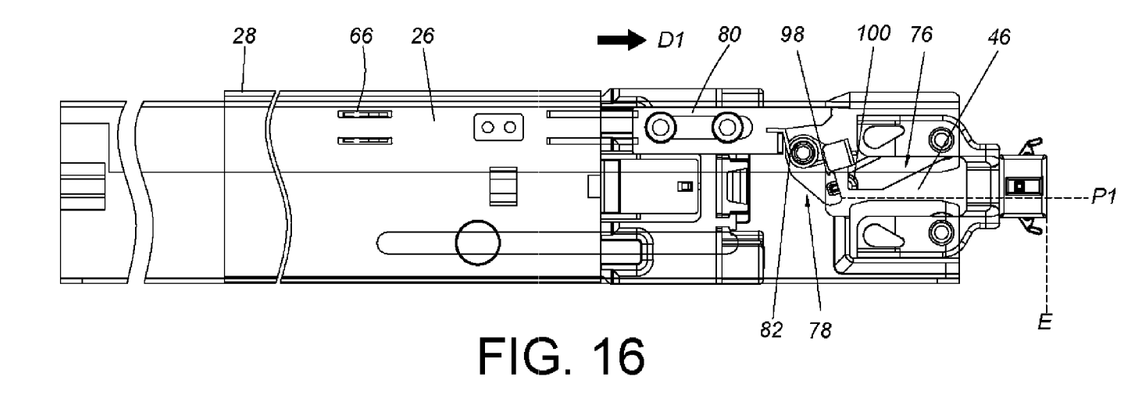
FIG. 16 is a diagram showing the slide rail of the slide rail device being moved to an extension position along the first direction relative to the auxiliary component according to an embodiment of the present invention, wherein a locking member is located at a first position and blocks a mounting math of the slide rail.
Figure 17:
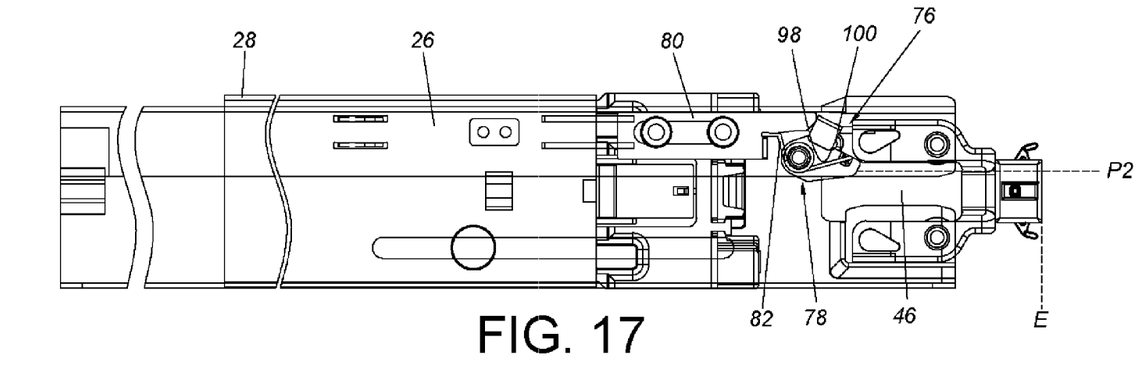
FIG. 17 is a diagram showing the locking member of FIG. 16 being located at a second position to be away from the mounting path of the slide rail.

As shown in FIG. 16 and FIG. 17, the locking member 78 is configured to be located between a first position P1 and a second position P2 relative to the operating member 76.

When the locking member 78 is located at the first position P1, the locking member 78 (or the operating member 76) blocks the mounting path 46 in order to close the mounting path 46. In addition, the locking member 78 comprises a first abutting part 98, and the operating member 76 comprises a second abutting part 100.

When the slide rail 26 is moved to an extension position E along the first direction D1 relative to the auxiliary component 28, a user can operate the operating member 76 to deflect and move the locking member 78 from the first position P1 to the second position P2 in response to the operation of the operating member 76, and the locking member 78 then abuts against the operating member 76. For example, the first abutting part 98 of the locking member 78 abuts against the second abutting part 100 of the operating member 76 in order to hold the locking member 78 (or the operating member 76) at the second position P2. When the locking member 78 is located at the second position P2, the locking member 78 (or the operating member 76) is away from the mounting path 46 in order to open the mounting path 46. In addition, when the locking member 78 is moved from the first position P1 to the second position P2, the movable member 80 is moved along a direction opposite to the first direction D1 in response to the movement of the locking member 78. Preferably, through the elastic force of the elastic member 82, the locking member 78 can be held at the second position P2 to abut against the movable member 80 and the operating member 76.

Figure 18:
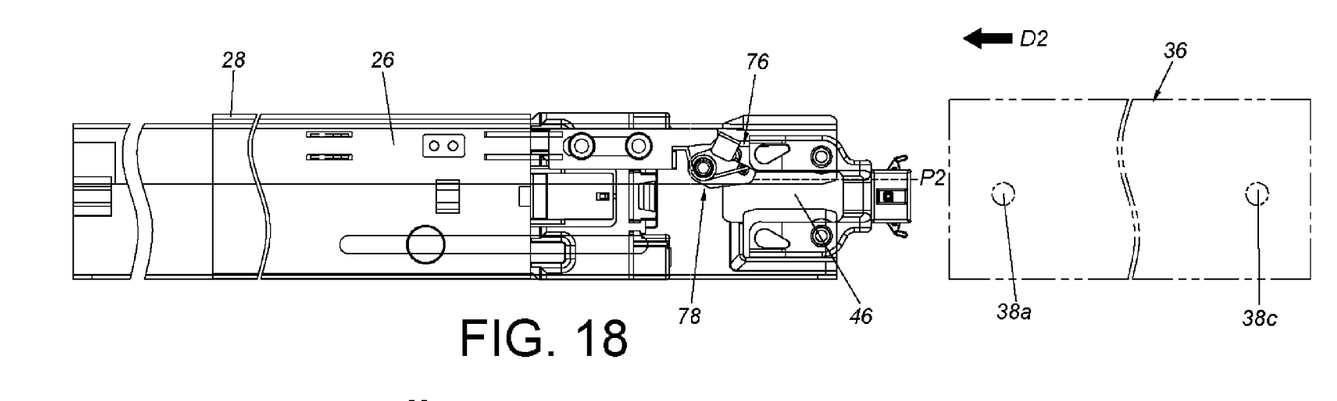
FIG. 18 is a diagram showing the slide rail of the slide rail device of FIG. 17 being configured to mount the carried object.
Figure 19:
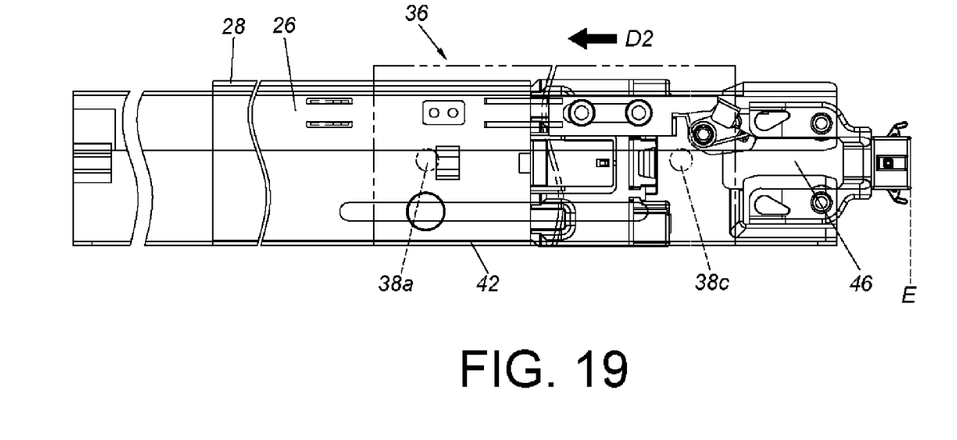
FIG. 19 is a diagram showing the carried object of FIG. 18 being mounted to the slide rail, and the slide rail being moved relative to the auxiliary component along a second direction.

As shown in FIG. 18 and FIG. 19, when the locking member 78 is located at the second position P2 (that is to say, the locking member 78 and the operating member 76 are away from the mounting path 46), the user can mount the carried object 36 to the slide rail 26 along a second direction D2. In such mounting process, the plurality of mounting members of the carried object 36 (only the first mounting member 38a and the third mounting member 38c are shown in FIG. 18) can sequentially pass through the mounting path 46 of the slide rail 26, and the supporting part 42 of the slide rail 26 is configured to support the carried object 36. When the third mounting member 38c of the carried object 36 passes through the mounting path 46 of the slide rail 26 along the second direction D2 with the supporting part 42 of the slide rail 26 supporting the carried object 36, the user can apply a force to move the slide rail 26 relative to the auxiliary component 28 from the extension position E toward the retracted position R along the second direction D2.

Figure 20:
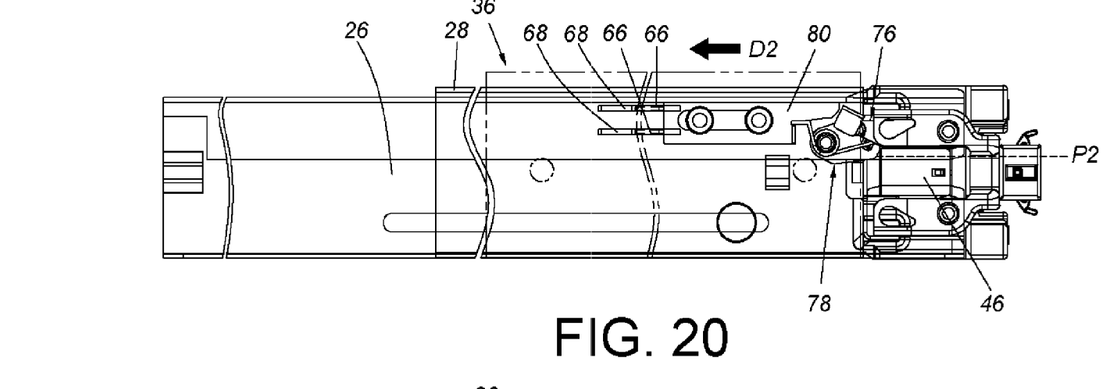
FIG. 20 is a diagram showing the slide rail of FIG. 19 being moved relative to the auxiliary component along the second direction, and a portion of the movable member contacting the engagement part of the engagement member.
Figure 21:
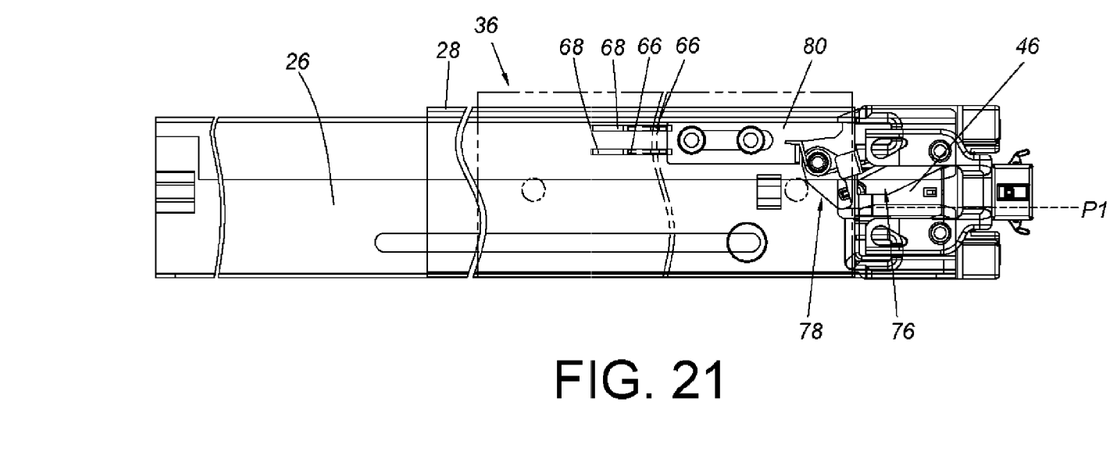
FIG. 21 is a diagram showing the movable member of FIG. 20 being moved in response to blocking of the engagement part of the engagement member in order to drive the locking member or the operating member to move from the second position back to the first position.

As shown in FIG. 20 and FIG. 21, during the aforementioned moving process, when the auxiliary hole 68 of the slide rail 26 corresponds to the engagement part 66 of the engagement member 62, the engagement part 66 penetrates through the auxiliary hole 68 once again in response to the elastic force of the elastic part 64 (please refer to FIG. 11) in order to block the movable member 80. Therefore, when the slide rail 26 continues to move along the second direction D2, the movable member 80 is moved relative to the slide rail 26 along the first direction D1 (the direction opposite to the second direction) in response to the blocking of the engagement part 66, such that the movable member 80 can drive the locking member 78 (or the operating member 76) to move from the second position P2 to the first position P1 in order to block the mounting path 46 once again. In other words, the locking member 78 and the operating member 76 can automatically return to an initial state without manual operation (no need to operate the locking member 78 and the operating member 76), such that the locking member 78 (or the operating member 76) can close the mounting path 46 when the locking member 78 is located at the first position P1. Therefore, the carried object 36 cannot be detached from the slide rail 26.

Figure 22:
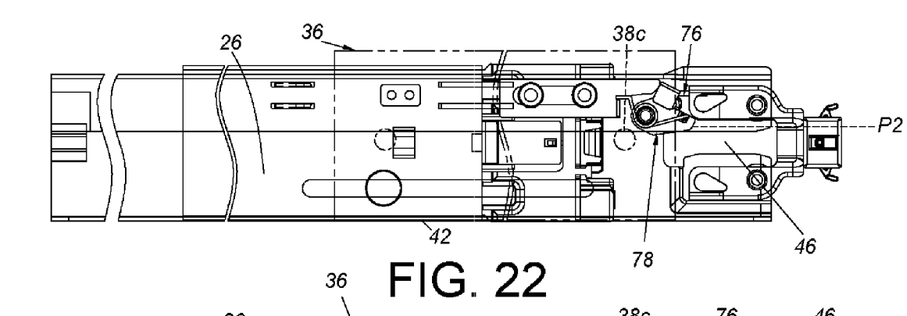
FIG. 22 is a diagram showing the slide rail being located at the extension position relative to the auxiliary component and the locking member or the operating member being located at the second position according to an embodiment of the present invention.
Figure 23:
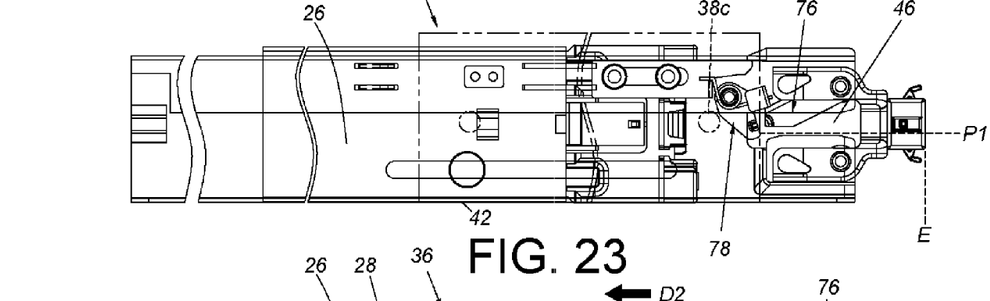
FIG. 23 is a diagram showing the locking member or the operating member of FIG. 22 capable of being manually moved from the second position back to the first position.

As shown in FIG. 22 and FIG. 23, in another operation mode, when the third mounting member 38c of the carried object 36 passes through the mounting path 46 of the slide rail 26 with the supporting part 42 of the slide rail 26 supporting the carried object 36, the user can manually operate the operating member 76 or the locking member 78, in order to move the locking member 78 from the second position P2 to the first position P1. Similarly, the mounting path 46 can be closed as well.

Figure 24:
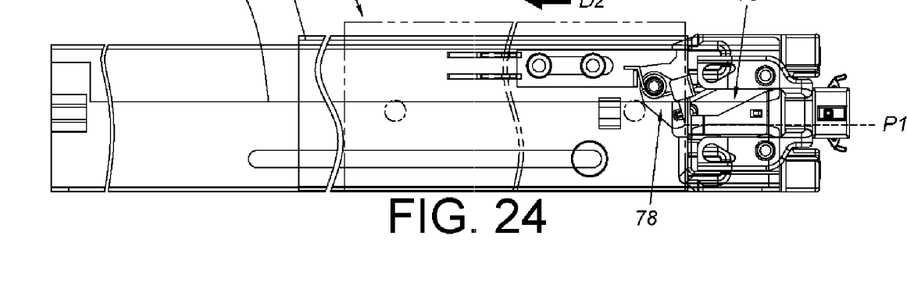
FIG. 24 is a diagram showing the slide rail of FIG. 23 being moved relative to the auxiliary component along the second direction.

As shown in FIG. 24, when the locking member 78 is located at the first position P1, the user can apply a force to retract the slide rail 26 relative to the auxiliary component 28 from the extension position E along the second direction.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail device, comprising:
   an auxiliary component configured to be mounted to a rack;
   a slide rail movably mounted to the auxiliary component, the slide rail comprising a side wall, wherein a first wall section and a second wall section are bent relative to the side wall, a mounting path is formed between the first wall section and the second wall section, the slide rail is configured to mount a carried object having a plurality of mounting members by moving the carried object toward the slide rail with the plurality of mounting members entering the mounting path along a longitudinal direction of the slide rail to sequentially pass through the mounting path;
   an operating member movably mounted to the slide rail; and
   a locking member movable relative to the slide rail between a first position and a second position;
   wherein when the locking member is located at the first position, the locking member is configured to block the mounting member from passing through the mounting path;
   wherein when the locking member is located at the second position, the operating member is configured to abut against the locking member to hold the locking member at the second position without blocking the mounting member from passing through the mounting path.

2. The slide rail device of claim 1, wherein the auxiliary component has a through hole, the slide rail device further comprises an engagement member mounted to the auxiliary component, the engagement member has an elastic part and an engagement part, the engagement part is configured to be engaged with the through hole in response to an elastic force of the elastic part.

3. The slide rail device of claim 2, wherein one of the slide rail and the engagement part has a disengagement feature, the disengagement feature comprises an inclined face or a curved face.

4. The slide rail device of claim 2, wherein the slide rail comprises an auxiliary hole, the engagement part of the engagement feature is configured to pass through the auxiliary hole in response to the elastic force of the elastic part.

5. The slide rail device of claim 4, wherein the slide rail comprises a first hole wall and a second hole wall, the auxiliary hole is located between the first hole wall and the second hole wall.

6. The slide rail device of claim 4, further comprising a movable member movably mounted to the slide rail, wherein when the slide rail is moved relative to the auxiliary component from an extended position toward a retracted position, the engagement part of the engagement member is configured to block the movable member, and the movable member is moved relative to the slide rail in response to the blocking of the engagement part, in order to drive the locking member to move from the second position to the first position.

7. The slide rail device of claim 1, further comprising a movable member movably mounted to the slide rail, wherein when the locking member is moved from the first position to the second position, the movable member is moved in response to the movement of the locking member, and the locking member abuts against the operating member.

8. The slide rail device of claim 7, further comprising an elastic member configured to provide an elastic force between the locking member and the movable member.

9. The slide rail device of claim 7, wherein the locking member comprises a first abutting part, the operating member comprises a second abutting part, when the operating member is operated, the locking member is moved from the first position toward the second position in response to the operation of the operating member, and the first abutting part of the locking member abuts against the second abutting part of the operating member in order to hold the locking member at the second position.

10. The slide rail device of claim 7, wherein one of the slide rail and the movable member has an extension hole, the slide rail device further comprises a connecting member penetrating through a portion of the extension hole to be connected between the slide rail and the movable member.

11. The slide rail device of claim 7, wherein the locking member is pivoted to the slide rail.

12. The slide rail device of claim 7, wherein the operating member is pivoted to the slide rail.

13. The slide rail device of claim 1, wherein one of the slide rail and the auxiliary component has a mounting hole, the slide rail device further comprises a connecting member penetrating through a portion of the mounting hole to be connected between the auxiliary component and the slide rail.

14. A rack system comprising:
a rack;
a carried object having a plurality of mounting members protruded from a side part of the carried object and
a slide rail device, comprising:
an auxiliary component mounted to the rack;
a slide rail movably mounted to the auxiliary component, the slide rail having a side wall and an auxiliary hole, wherein a first wall section and a second wall section are bent relative to the side wall, a mounting path is formed between the first wall section and the second wall section, the slide rail is configured to mount the carried object by moving the carried object toward the slide rail with the plurality of mounting members entering the mounting path along a longitudinal direction of the slide rail to sequentially pass through the mounting path;
a locking member pivoted to the slide rail;
an operating member pivoted to the slide rail and configured to operatively move the locking member between a first position and a second position;
a movable member movably mounted to the slide rail; and
an engagement member mounted to the auxiliary component, the engagement member having an elastic part and an engagement part;
wherein when the locking member is located at the first position, the locking member is configured to block the mounting member from passing through the mounting path;
wherein when the locking member is located at the second position, the operating member is configured to abut against the locking member to hold the locking member at the second position without blocking the mounting member from passing through the mounting path;
wherein when the locking member is located at the second position and the slide rail is moved relative to the auxiliary component from an extended position toward a retracted position, the engagement part of the engagement member passes through the auxiliary hole of the slide rail in response to the elastic force of the elastic member to block the movable member, and the movable member is moved relative to the slide rail in response to the blocking of the engagement part, in order to drive one of the locking member and the operating member to move from the second position to the first position.

15. The rack system of claim 14, wherein one of the auxiliary component and the slide rail has a mounting hole, the slide rail device further comprises a connecting member penetrating through a portion of the mounting hole to be connected between the auxiliary component and the slide rail.

16. The rack system of claim 14, further comprising an elastic member configured to provide an elastic force between the locking member and the movable member.

17. The slide rail device of claim 1, wherein the slide rail further comprises a supporting part substantially perpendicularly connected to the side wall and configured to contact and support a bottom of the carried object.

18. The rack system of claim 14, wherein the slide rail further comprises a supporting part substantially perpendicularly connected to the side wall and configured to contact support a bottom of the carried object.

* * * * *